United States Patent [19]

Osborne

[11] Patent Number: 4,540,939

[45] Date of Patent: Sep. 10, 1985

[54] APPARATUS FOR MONITORING CURRENT LEVELS IN AN A.C. TRANSMISSION LINE

[75] Inventor: Colin T. Osborne, Tring, England

[73] Assignee: Lucas Industries Public Limited Company, Birmingham, England

[21] Appl. No.: 482,036

[22] Filed: Apr. 4, 1983

[30] Foreign Application Priority Data

Apr. 16, 1982 [GB] United Kingdom ............... 8211160

[51] Int. Cl.$^3$ ............................................. G01R 31/08
[52] U.S. Cl. ..................................... 324/127; 324/52; 361/63; 361/87
[58] Field of Search ...................... 324/140 R, 127, 52, 324/114, 133; 361/63, 64, 65, 66, 67, 87, 93, 44, 45

[56] References Cited

U.S. PATENT DOCUMENTS 3,686,531  8/1972  Decker et al. ................... 361/93 X
4,110,808  8/1978  Hobson, Jr. et al. ................ 361/44

Primary Examiner—Stewart J. Levy
Assistant Examiner—Stephen M. Baker
Attorney, Agent, or Firm—Ladas & Parry

[57] ABSTRACT

An apparatus for monitoring current levels at adjacent zones along an a.c. transmission line is provided by current transformers at said zones, the secondaries of the transformers being connected in a series circuit such that currents induced in the secondaries are all in the same direction in said series circuit. Resistors are connected between a common connection of the series circuit and respective interconnections between the transformer secondaries. Devices are provided for monitoring the voltages across the resistors.

8 Claims, 2 Drawing Figures

APPARATUS FOR MONITORING CURRENT LEVELS IN AN A.C. TRANSMISSION LINE

It is well known to monitor a zone of an a.c. transmission line for current leakage by providing two identical current transformers at respective ends of the zone and connecting the output windings of these transformers "back-to-back". If the current through the primaries of the two transformers is identical, no voltage will exist across the mid-points of the connection between the transformer outputs. In order to effect monitoring of a plurality of transmission line zones it has previously been considered necessary to provide a corresponding plurality of pairs of current transformers. In such a system an additional current transformer is required for monitoring absolute current level in the transmission line, to provide an over-current indication in the event for example, of a short circuit across the load.

It is an object of the present invention to provide an apparatus in which monitoring of a plurality of adjacent zones of an a.c. transmission line may be effected by current transformers whose number is one in excess of the number of said zones, and in which no additional transformer is required for over-current monitoring.

It is a further object of the invention to provide an apparatus as aforesaid which also indicates the current level in a part of said transmission line.

According to the invention, an apparatus for monitoring difference in current levels between adjacent zones of an a.c. transmission line comprises a plurality of current transformers responsive to current levels at a plurality of locations on said line, the secondary windings of said transformers being connected in a series circuit so that currents induced in said secondary windings are all in the same direction in said series circuit, a plurality of first resistances between a common connector of said series circuit and the respective interconnections between said secondary windings of adjacent transformers, and means for detecting the volatages across said first resistances.

A preferred embodiment includes a second resistance connected in said series circuit between the secondary windings of transformers at opposite ends of said plurality of zones, said common connector extending between said second resistance and the secondary winding of a transformer at one of said opposite ends, and means for detecting the voltage across said second resistance.

An embodiment of the invention will now be described, by way of example only, and with reference to the accompanying drawings, in which.

Figure 1:
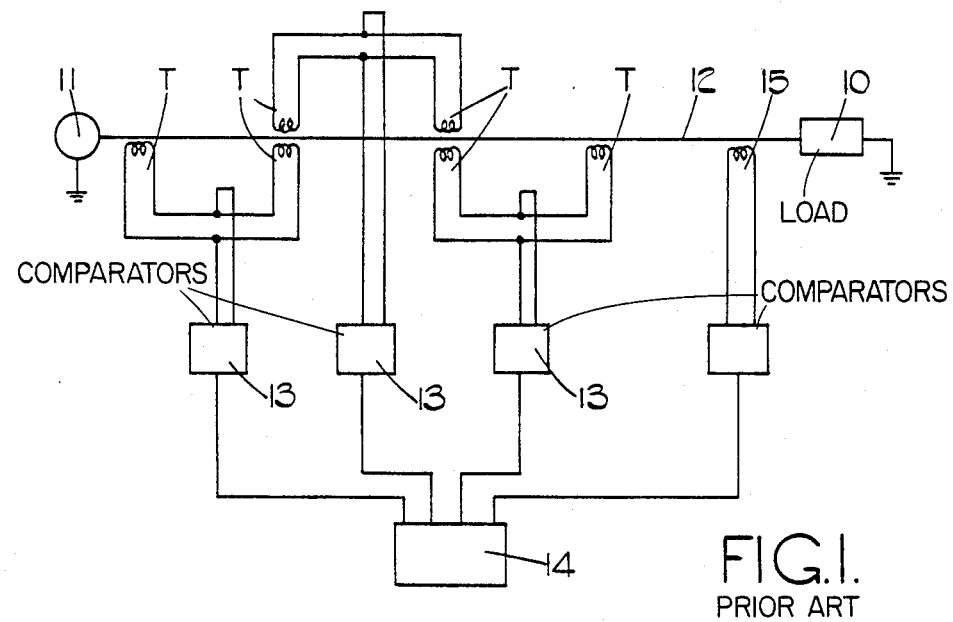
FIG. 1 is a diagram of the prior art arrangement referred to above.

In the arrangement shown in FIG. 1 a load 10 is supplied with alternating current from a source 11 by way of a transmission line 12. Current transformers T are responsive to current at spaced locations along the line 12 and are connected in pairs so that when the current in the line 12 at one location is equal to that at an adjacent location, there is no potential difference between the mid-points of the connections. The voltages across these mid-point connections are monitored by detection and comparator circuits 13 which provide signals to an indicator device 14 when the detected voltages exceed predetermined levels. It will be seen that two current transformers are required to detect a current difference between each pair of locations. Additionally, a further current transformer 15 is required if it is desired to monitor the level of load current.

The present invention provides an apparatus in which differences in current levels at the ends of a plurality of zones along an a.c. transmission line, as well as the magnitude of a load current, can be detected using a number of current transformers which is only one in excess of the number of the said zones.

Figure 2:
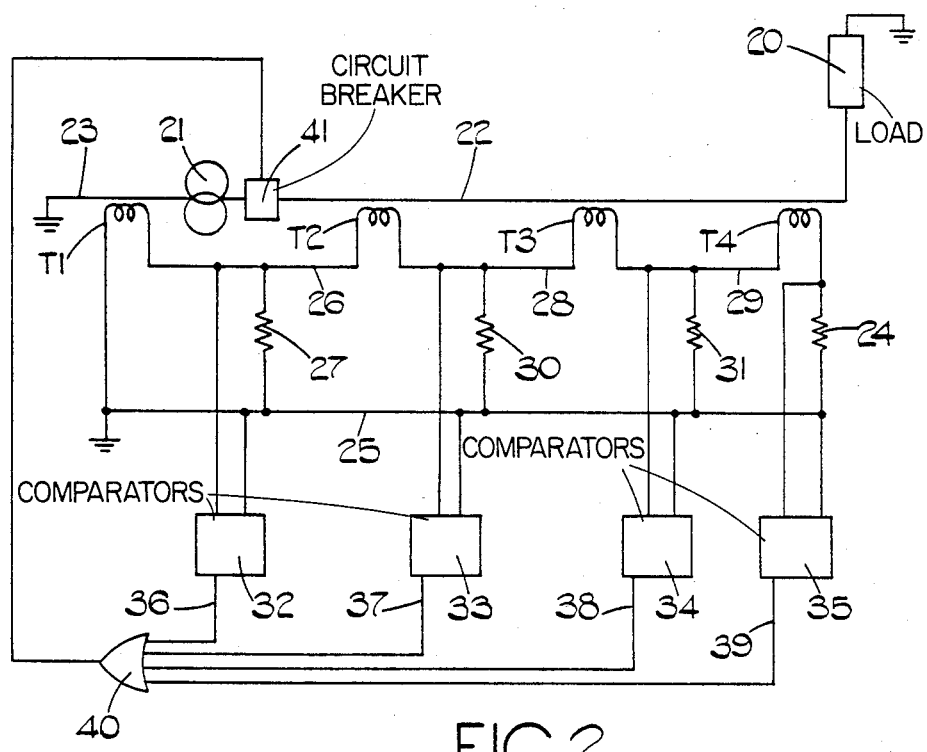
FIG. 2 is a diagram of a current-level monitoring apparatus according to the present invention.

In FIG. 2 a load 20 is supplied with current by an alternator 21 through a distributor line 22, the circuit through the load 20 being completed by an earth return line 23. The lines 22, 23 are hereafter considered as an a.c. transmission line for the load 20.

A plurality of current transformers T1, T2, T3, T4 are responsive to the currents at a plurality of locations along the a.c. transmission line, the transformer T1 being located adjacent the alternator 21, and the transformer T4 being located adjacent the load 20. The transformer pairs T1, T2; T2, T3 and T3, T4 define zones of the line 22 and are connected to detect differences between current flow at the ends of each zone. The secondary windings of the transformers T1 to T4 are connected in a series circuit which includes a resistor 24 and a common earth rail 25.

A connection 26 between the transformers T1, T2 is connected to the earth rail 25 through a resistor 27. Connections 28, 29 between transformers T2, T3 and T3, T4 respectively, are similarly connected to the rail 25 through respective resistors 30, 31. Voltage detector and indicating circuits 32, 33, 34, 35 are connected across the resistors 27, 30, 31, 24 respectively.

In the absence of any leakage in the transmission line 22, 23 the currents flowing through the secondary windings of the transformers T1, T2, T3, T4 will all be equal, and this current will flow through the resistor 24. However, since the current flowing, for example, through the secondary winding of transformer T2 is equal to that flowing through the secondary winding of transformer T1, no current flows through the resistor 27 to the rail 25, and the circuit 32 provides no voltage indication. If however a leakage occurs in the transmission line 22, 23 between the transformers T1, T2, the resulting difference between the currents flowing in the secondary windings of transformers T1, T2 will result in current through the resistor 27, and a voltage indication will be provided by the circuit 32.

Similarly, circuits 33, 34 provide voltage indications only in the event of differences in transmission line current sensed between the transformers T2, T3 and T3, T4.

Current flowing through the resistor 24 is always that induced in the secondary winding of transformer T4, and the voltage across resistor 24 provides an indication of the current in the transmission line 22, 23 at that point. Since the transformer T4 is adjacent the load 10 the detector circuit 35 effectively provides an indication of the load current. Any or all of the circuits 32–35 may include a reference voltage source so that an indication is provided if an unacceptable level of load current is detected by any of the transformers T1–T4. This indication may include a signal on a respective one of lines 36, 37, 38, 39 which are applied to an OR gate 40. A circuit breaker device 41 in the line 22 is energisable by an output signal from the gate 40, so that excessive current flows in the line 22 are prevented.

The arrangement thus provides for monitoring of current flow through three zones of the transmission line 22, 23 using only four current transformers. It will be apparent that any number of transmission line zones could be similarly monitored using a number of current transformers which is only one in excess of the number of said zones. Additionally, the current output from one of the transformers may be used to provide an indication of the current in a part of the transmission line.

Connection of the resistors 24, 27, 30, 31 to a common earth rail 25, and connecting one input of each of the circuits 32-35 to that earth rail has the effect that these circuits, being related to a common earth, may be of simpler construction than would otherwise be the case.

It will be understood that an apparatus according to the invention may also be used for monitoring multiphase supplies, current transformers and detection devices being included in each phase.

I claim:

1. An apparatus for monitoring difference in current levels between adjacent zones of an a.c. transmission line comprising a plurality of current transformers responsive to current levels at a plurality of locations on said line, the secondary windings of said transformers being connected in a series circuit so that currents induced in said secondary windings are all in the same direction in said series circuit, a plurality of first resistances between a common connector of said series circuit and respective interconnections between said secondary windings of adjacent transformers, and means for detecting the voltages across said first resistances.

2. an apparatus as claimed in claim 1 which includes a second resistance connected in said series circuit between the secondary windings of transformers at opposite ends of said plurality of zones, said common connector extending between said second resistance and the secondary winding of a transformer at one of said opposite ends, and means for detecting the voltage across said second resistance.

3. An apparatus as claimed in claim 1 in which said first resistances are connected directly between the common connector and the respective interconnections between secondary windings.

4. An apparatus as claimed in claim 1 in which said first resistances are connected between the common connector and each respective interconnections between said secondary winding.

5. An apparatus as claimed in claim 1 in which said common connector directly connects current transformers at opposite extreme ends of said transmission line.

6. An apparatus as claimed in claim 1 in which the means for detecting the voltage across said first resistances detect only the voltage across one respective first resistance.

7. An apparatus as claimed in claim 1 in which the means for detecting the voltage across said first resistance are connected directly across only one respective first resistance.

8. An apparatus as claimed in claim 2 in which said common connector extends directly between said second resistance and said secondary winding of said transformer at one of said opposite ends.

* * * * *